United States Patent
Ooi et al.

(10) Patent No.: US 8,652,954 B2
(45) Date of Patent: Feb. 18, 2014

(54) METHOD FOR MANUFACTURING SILICON CARBIDE SEMICONDUCTOR DEVICE

(75) Inventors: Naoki Ooi, Osaka (JP); Hiromu Shiomi, Osaka (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 204 days.

(21) Appl. No.: 13/352,104

(22) Filed: Jan. 17, 2012

(65) Prior Publication Data

US 2012/0184092 A1 Jul. 19, 2012

Related U.S. Application Data

(60) Provisional application No. 61/433,776, filed on Jan. 18, 2011.

(30) Foreign Application Priority Data

Jan. 17, 2011 (JP) .................................. 2011-006568

(51) Int. Cl.
*H01L 21/265* (2006.01)

(52) U.S. Cl.
USPC ............ 438/519; 257/E21.336; 257/E21.334; 438/514

(58) Field of Classification Search
USPC ............ 438/519, 514; 257/E21.336, E21.334
See application file for complete search history.

(56) References Cited

U.S. PATENT DOCUMENTS

| | | | | |
|---|---|---|---|---|
| 3,909,304 A | * | 9/1975 | Cho | 438/506 |
| 3,966,501 A | * | 6/1976 | Nomura et al. | 438/442 |
| 5,126,231 A | * | 6/1992 | Levy | 430/313 |
| 6,933,158 B1 | * | 8/2005 | Lensing et al. | 438/16 |
| 6,940,110 B2 | * | 9/2005 | Takahashi et al. | 257/288 |
| 7,005,364 B2 | * | 2/2006 | Niisoe | 438/514 |
| 7,074,643 B2 | * | 7/2006 | Ryu | 438/105 |
| 7,238,577 B1 | * | 7/2007 | Shafi | 438/268 |
| 7,393,767 B2 | * | 7/2008 | Lee et al. | 438/527 |
| 7,396,747 B2 | * | 7/2008 | Boyd et al. | 438/522 |
| 7,517,807 B1 | * | 4/2009 | Tucker et al. | 438/739 |
| 8,097,530 B2 | * | 1/2012 | Nakamura | 438/522 |
| 2004/0211980 A1 | | 10/2004 | Ryu | |
| 2005/0059226 A1 | * | 3/2005 | Rouh et al. | 438/528 |

(Continued)

FOREIGN PATENT DOCUMENTS

| | | | | |
|---|---|---|---|---|
| EP | 2092552 | * | 8/2009 | ............ H01L 21/033 |
| JP | 2002-313791 A | | 10/2002 | |

(Continued)

OTHER PUBLICATIONS

Maeda, Kazuo, "Advanced LSI Process Technique", 4th Edition, Kogyo Chosakai Publishing Co., Ltd., pp. 283-290, Apr. 20, 1988.

*Primary Examiner* — David Vu
*Assistant Examiner* — Caleb Henry
(74) *Attorney, Agent, or Firm* — Venable LLP; Michael A. Sartori (57) ABSTRACT

A method for manufacturing a silicon carbide semiconductor device includes the step of forming a mask pattern of a silicon oxide film by removing a portion of the silicon oxide film by means of etching employing a gas containing oxygen gas and at least one fluorine compound gas selected from a group consisting of $CF_4$, $C_2F_6$, $C_3F_8$, and $SF_6$.

6 Claims, 7 Drawing Sheets

(56) References Cited

U.S. PATENT DOCUMENTS

2008/0258220 A1* 10/2008 Bedell et al. .................. 257/350
2009/0042375 A1* 2/2009 Sawada et al. ................ 438/522
2009/0117722 A1* 5/2009 Tucker et al. ................. 438/519
2010/0035420 A1* 2/2010 Tamaso et al. ................ 438/514
2010/0291762 A1* 11/2010 Tarui ............................. 438/519
2011/0147764 A1* 6/2011 Dhar et al. ...................... 257/77

FOREIGN PATENT DOCUMENTS

| JP | 2005-229105 A | 8/2005 |
| JP | 2006-128191 A | 5/2006 |
| JP | 2006-147846 A | 6/2006 |
| JP | 2006-524433 A | 10/2006 |
| JP | 2008-147576 A | 6/2008 |

* cited by examiner

METHOD FOR MANUFACTURING SILICON CARBIDE SEMICONDUCTOR DEVICE

BACKGROUND OF THE INVENTION

1. Field of the Invention

The present invention relates to a method for manufacturing a silicon carbide semiconductor device.

2. Description of the Background Art

In manufacturing a semiconductor device, a step of selectively forming an impurity region in a semiconductor substrate is required. For example, when forming an n channel type MOSFET (Metal Oxide Semiconductor Field Effect Transistor), a step of forming a p type region in a portion of an n type semiconductor substrate and then forming an n+ type region in a portion of the p type region is often performed to obtain an npn structure. In other words, double impurity regions different from each other in terms of spreading are formed.

In the case where a silicon substrate is used as the semiconductor substrate, spreading of an impurity region can be adjusted by means of diffusion of impurity. Hence, a double diffusion method utilizing this has been widely used.

Meanwhile, in the case where a silicon carbide substrate is used as the semiconductor substrate, a diffusion coefficient for an impurity is small. This makes it difficult to adjust spreading of an impurity region by means of diffusion of impurity.

In other words, when a region having ions implanted therein is subjected to activation annealing, the region will be formed into an impurity region with almost no change. Hence, the double diffusion method cannot be used.

In view of the above, for example, the following method is disclosed in Japanese Patent Laying-Open No. 2008-147576 (Patent Literature 1). Specifically, first, an ion implantation mask made of tungsten is formed on a silicon carbide substrate. Then, ions of an n type impurity are implanted into the silicon carbide substrate. Thereafter, a portion of the ion implantation mask is etched to expose a larger area of the silicon carbide substrate. Then, ions of a p type impurity are implanted thereinto. According to this method, variation in a positional relation between the double impurity regions different from each other in spreading can be reduced by self-alignment. This results in reduced variation in characteristics of the semiconductor device.

However, in the method disclosed in Patent Literature 1, tungsten, which is large in internal stress, is used for the ion implantation mask. Accordingly, a difference in internal stress between the ion implantation mask made of tungsten and the silicon carbide substrate may cause warpage of the silicon carbide substrate. Particularly, it is considered that the warpage in the silicon carbide substrate tends to be large because recent silicon carbide substrates have large areas.

Thus, in the method disclosed in Patent Literature 1, it is difficult to uniformly control an etching width in etching the portion of the ion implantation mask made of tungsten so as to expose a larger area of the silicon carbide substrate. Accordingly, precision in spreading of impurity regions is decreased, disadvantageously.

In view of the above, the present invention has its object to provide a method for manufacturing a silicon carbide semiconductor device so as to increase precision in spreading of impurity regions.

SUMMARY OF THE INVENTION

The present invention provides a method for manufacturing a silicon carbide semiconductor device, including the steps of: preparing a silicon carbide substrate; forming a silicon oxide film on the silicon carbide substrate; forming a first mask pattern of the silicon oxide film by removing a portion of the silicon oxide film by means of first etching employing a first gas containing $CHF_3$; forming a first impurity region having first conductivity type by means of ion implantation of a first ion into the silicon carbide substrate including the silicon oxide film having the first mask pattern; forming a second mask pattern of the silicon oxide film by removing a portion of the silicon oxide film by means of second etching employing a second gas containing oxygen gas and at least one fluorine compound gas selected from a group consisting of $CF_4$, $C_2F_6$, $C_3F_8$, and $SF_6$; and forming a second impurity region having second conductivity type different from the first conductivity type by means of ion implantation of a second ion into the silicon carbide substrate including the silicon oxide film having the second mask pattern.

Here, in the method for manufacturing the silicon carbide semiconductor device in the present invention, a ratio of the oxygen gas in the second gas is preferably 30 volume % or greater.

Further, in the method for manufacturing the silicon carbide semiconductor device in the present invention, etching selectivity in the second etching is preferably not less than 0.5 and not more than 2.

Further, in the method for manufacturing the silicon carbide semiconductor device in the present invention, the step of forming the silicon oxide film preferably includes the steps of: forming an etching stop layer on the silicon carbide substrate; and forming the silicon oxide film on the etching stop layer.

Further, in the method for manufacturing the silicon carbide semiconductor device in the present invention, the etching stop layer preferably contains at least one metal selected from a group consisting of nickel, aluminum, and titanium.

Further, in the method for manufacturing the silicon carbide semiconductor device in the present invention, the etching stop layer is preferably constituted by a stack in which a first layer made of titanium, a second layer made of nickel or aluminum, and a third layer made of titanium are stacked in this order from the silicon carbide substrate side.

The present invention provides a method for manufacturing a silicon carbide semiconductor device so as to achieve improved precision in spreading of impurity regions.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The following describes an embodiment of the present invention. It should be noted that the same reference characters indicate the same or equivalent portions in the figures of the present invention.

Figure 1:
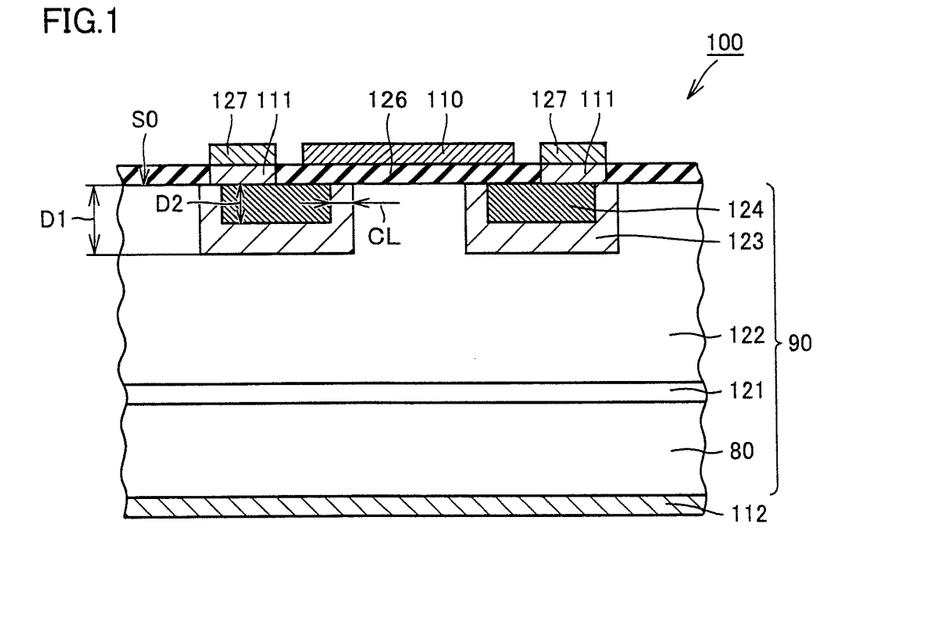
FIG. 1 is a schematic cross sectional view showing one exemplary silicon carbide semiconductor device manufactured according to a method for manufacturing a silicon carbide semiconductor device in the present embodiment.

FIG. 1 shows a schematic cross sectional view of one exemplary silicon carbide semiconductor device manufactured according to a method for manufacturing a silicon carbide semiconductor device in the present embodiment.

As shown in FIG. 1, the silicon carbide semiconductor device of the present embodiment is a MOSFET 100, specifically, a vertical type DiMOSFET (Double Implanted MOSFET).

MOSFET 100 includes: an epitaxial substrate 90; p regions 123 (each having a depth D1) and n+ regions 124 (each having a depth D2) formed in a surface of epitaxial substrate 90; source electrodes 111 and an oxide film 126 both formed on the surface of epitaxial substrate 90; upper source electrodes 127 formed on source electrodes 111; a gate electrode 110 formed on oxide film 126; and a drain electrode 112 formed on the backside surface of epitaxial substrate 90.

Epitaxial substrate 90 includes: a single-crystal substrate 80; a buffer layer 121 formed on single-crystal substrate 80; a breakdown voltage holding layer 122 provided on buffer layer 121; p regions 123 provided in a surface of breakdown voltage holding layer 122; and n+ regions 124 provided in p regions 123. The planar shape (shape viewed from above in FIG. 1) of MOSFET 100 can be, for example, a rectangle or square having sides with a length of 2 mm or greater.

Each of single-crystal substrate 80 and buffer layer 121 is preferably formed of silicon carbide having n type conductivity. Buffer layer 121 can be adapted to contain an n type impurity at a concentration of, for example, $5 \times 10^{17}$ cm$^{-3}$. Further, buffer layer 121 can be adapted to have a thickness of, for example, approximately 0.5 μm.

Breakdown voltage holding layer 122 is preferably formed of silicon carbide of n type conductivity. Breakdown voltage holding layer 122 can be adapted to contain an n type impurity at a concentration of, for example, $5 \times 10^{15}$ cm$^{-3}$. Further, breakdown voltage holding layer 122 can be adapted to have a thickness of, for example, approximately 10 μm.

Epitaxial substrate 90 has surface S0 in which the plurality of p regions 123 of p type conductivity are formed with a space therebetween. In surface S0, n+ region 124 is formed within each of p regions 123. On surface S0, p region 123 has a channel region sandwiched between breakdown voltage holding layer 122 and n+ region 124 and covered by gate electrode 110 with oxide film 126 interposed therebetween. The channel region has a channel length CL.

In surface S0, oxide film 126 is formed on an exposed portion of breakdown voltage holding layer 122 between the plurality of p regions 123. Here, oxide film 126 is formed to extend on n+ region 124 in one of the adjacent two p regions 123, this p region 123, the exposed portion of breakdown voltage holding layer 122 between the adjacent p regions 123, the other p region 123, and n+ region 124 in the other p region 123.

On oxide film 126, gate electrode 110 is formed. The portion of oxide film 126 on which gate electrode 110 is formed has a function as a gate insulating film.

On each of n+ regions 124, source electrode 111 is formed and may have a portion in contact with p region 123. On source electrode 111, upper source electrode 127 is formed.

The following describes one exemplary method for manufacturing MOSFET 100 shown in FIG. 1, with reference to schematic cross sectional views of FIG. 2 to FIG. 14.

Figure 2:
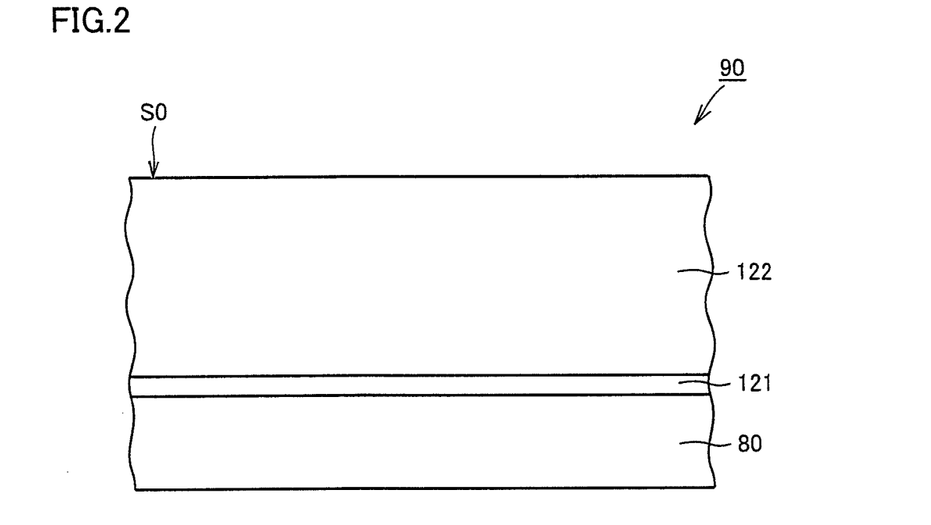
FIG. 2 is a schematic cross sectional view illustrating a part of manufacturing steps of an exemplary method for manufacturing the silicon carbide semiconductor device shown in FIG. 1.

First, as shown in FIG. 2, epitaxial substrate 90 (silicon carbide substrate) having surface S0 is prepared. Here, epitaxial substrate 90 can be formed by, for example, epitaxially growing buffer layer 121 and breakdown voltage holding layer 122 in this order on the surface of single-crystal substrate 80 by means of a CVD (Chemical Vapor Deposition) method or the like.

Figure 3:
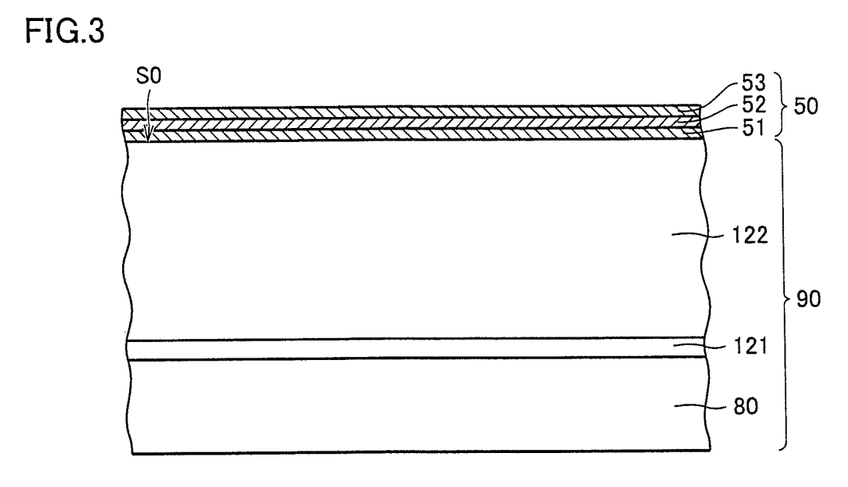
FIG. 3 is a schematic cross sectional view illustrating another part of the manufacturing steps of the exemplary method for manufacturing the silicon carbide semiconductor device shown in FIG. 1.

Next, as shown in FIG. 3, an etching stop layer 50 is formed on surface S0 of epitaxial substrate 90. Etching stop layer 50 is formed of a stack in which a first layer 51, a second layer 52, and a third layer 53 are stacked in this order from the epitaxial substrate 90 side.

Here, first layer 51 is preferably constituted by a titanium layer. Second layer 52 is preferably constituted by a nickel layer or an aluminum layer. Third layer 53 is preferably constituted by a titanium layer. In this case, first layer 51 thus constituted by the titanium layer is likely to achieve firm connection with epitaxial substrate 90. Second layer 52 constituted by the nickel layer or the aluminum layer is likely to achieve effective stop of etching described below. Third layer 53 constituted by the titanium layer is likely to achieve firm connection with a silicon oxide film described below.

It should be noted that each of first layer 51, second layer 52, and third layer 53 has a thickness of, for example, approximately 20 nm.

A configuration of etching stop layer 50 is not particularly limited so far as etching stop layer 50 is capable of stopping the etching described below. However, etching stop layer 50 preferably contains at least one metal selected from a group consisting of nickel, aluminum, and titanium, and is particularly preferably constituted by a stack in which first layer 51 constituted by titanium layer, second layer 52 constituted by the nickel layer or the aluminum layer, and third layer 53 constituted by the titanium layer are stacked in this order from the epitaxial substrate 90 side.

Figure 4:
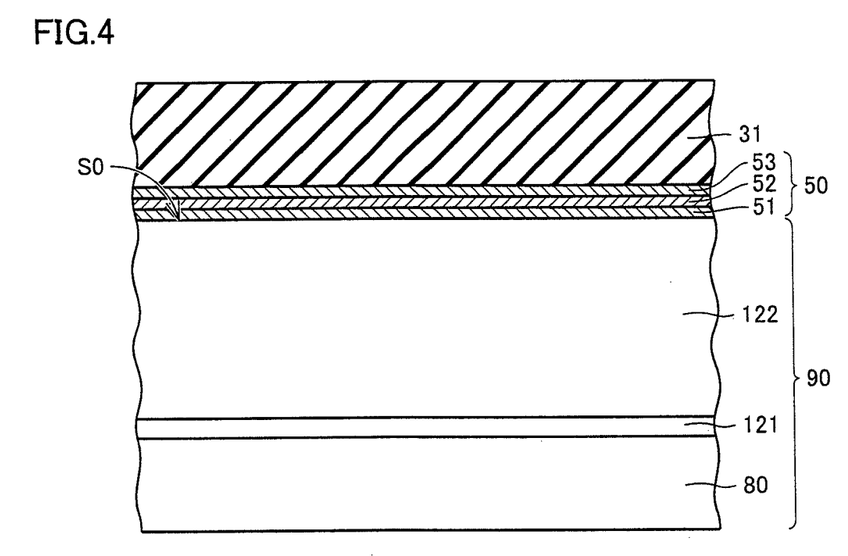
FIG. 4 is a schematic cross sectional view illustrating another part of the manufacturing steps of the exemplary method for manufacturing the silicon carbide semiconductor device shown in FIG. 1.

Next, as shown in FIG. 4, on a surface of etching stop layer 50, silicon oxide film 31 is formed. Here, silicon oxide film 31 can be deposited on the surface of etching stop layer 50 by means of, for example, the CVD method.

Silicon oxide film 31 preferably has a thickness of not less than 0.5 µm and not more than 3 µm, more preferably, not less than 1 µm and not more than 2.5 µm. When silicon oxide film 31 has a thickness of not less than 0.5 µm and not more than 3 µm, in particular, when silicon oxide film 31 has a thickness of not less than 1 µm and not more than 2.5 µm, the thickness thereof is sufficient to attain an ion implantation blocking ability sufficient for ion implantation of a subsequent step, and the film is not too thick and therefore restrains warpage resulting from film stress of silicon oxide film 31. Further, such a thickness is likely to facilitate processing by maintaining an aspect ratio in the etching step.

Figure 5:
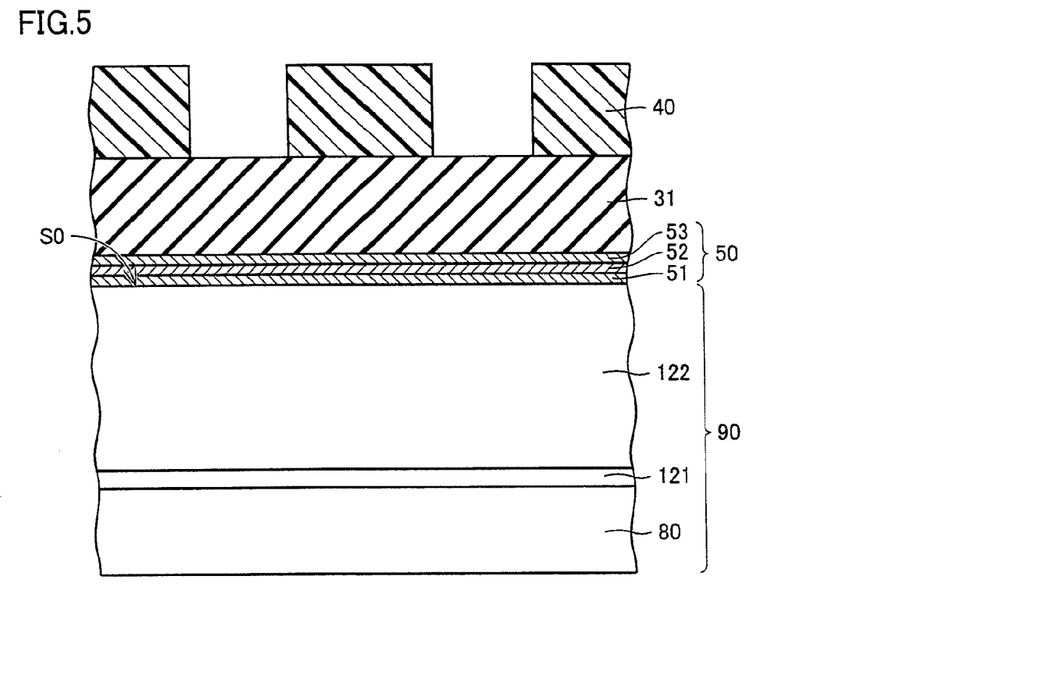
FIG. 5 is a schematic cross sectional view illustrating another part of the manufacturing steps of the exemplary method for manufacturing the silicon carbide semiconductor device shown in FIG. 1.

Next, as shown in FIG. 5, a photoresist pattern 40 is formed on the surface of silicon oxide film 31. Here, photoresist pattern 40 is formed to have openings at locations corresponding to openings of a below-described first mask pattern of silicon oxide film 31. Photoresist pattern 40 can be formed by, for example, applying a photoresist onto the entire surface of silicon oxide film 31, curing portions other than the portions corresponding to the openings, and removing the uncured portions corresponding to the openings.

Figure 6:
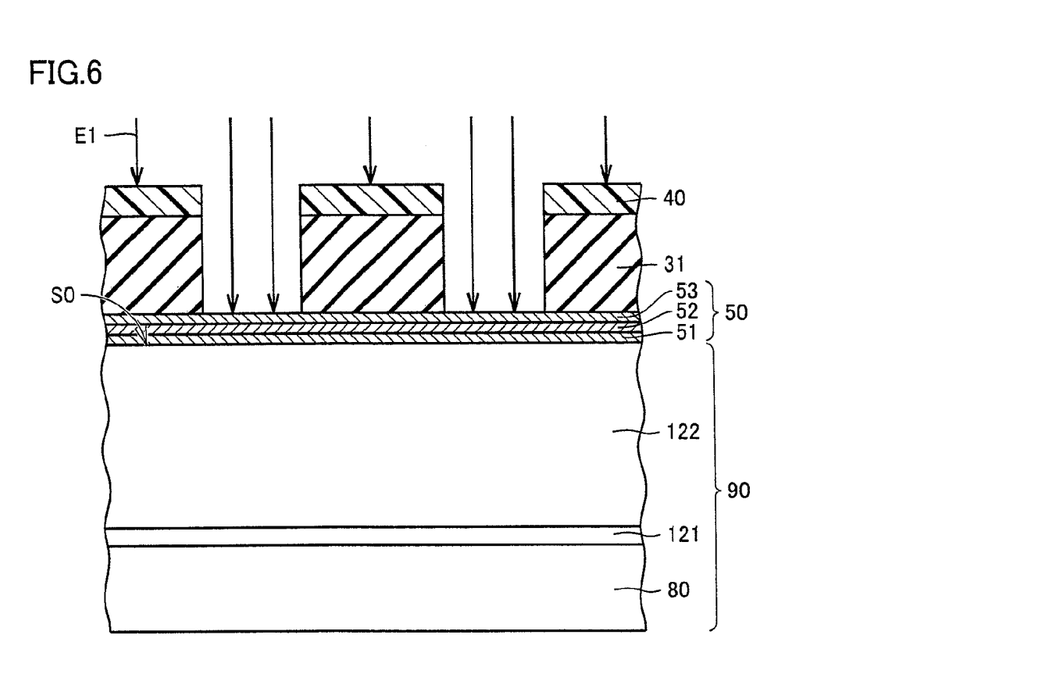
FIG. 6 is a schematic cross sectional view illustrating another part of the manufacturing steps of the exemplary method for manufacturing the silicon carbide semiconductor device shown in FIG. 1.

Next, as shown in FIG. 6, first etching E1 is performed to remove portions of silicon oxide film 31 using photoresist pattern 40 as a mask. In this way, the exposed portions of silicon oxide film 31 through the openings of photoresist pattern 40 are removed.

Here, as first etching E1, anisotropic dry etching is performed using a first gas containing $CHF_3$. In this way, the exposed portions of silicon oxide film 31 through the openings of photoresist pattern 40 are etched in the thickness direction (longitudinal direction) thereof to expose the surface of etching stop layer 50.

Figure 7:
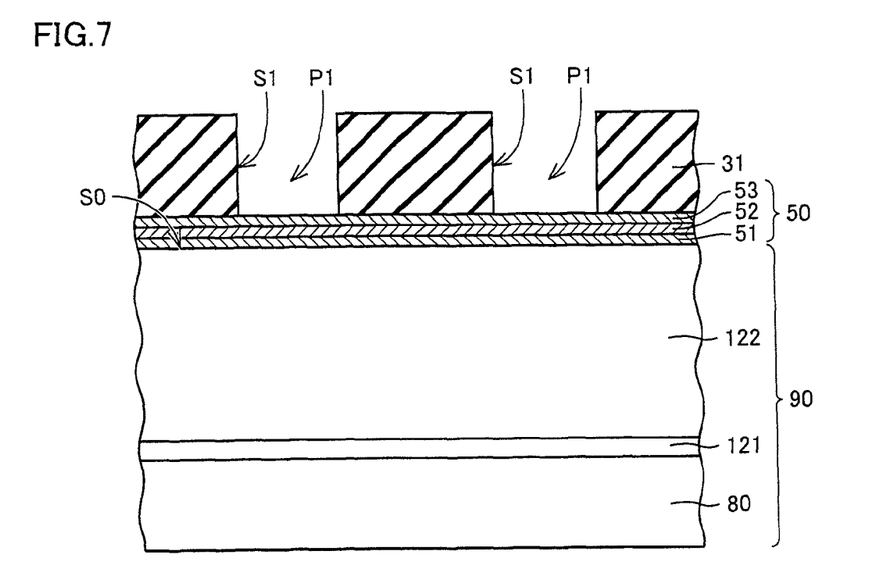
FIG. 7 is a schematic cross sectional view illustrating another part of the manufacturing steps of the exemplary method for manufacturing the silicon carbide semiconductor device shown in FIG. 1.

Next, as shown in FIG. 7, photoresist pattern 40 remaining on silicon oxide film 31 is removed. In this way, silicon oxide film 31 is provided with the first mask pattern including side walls S1 and openings P1 surrounded by side walls S1.

Figure 8:
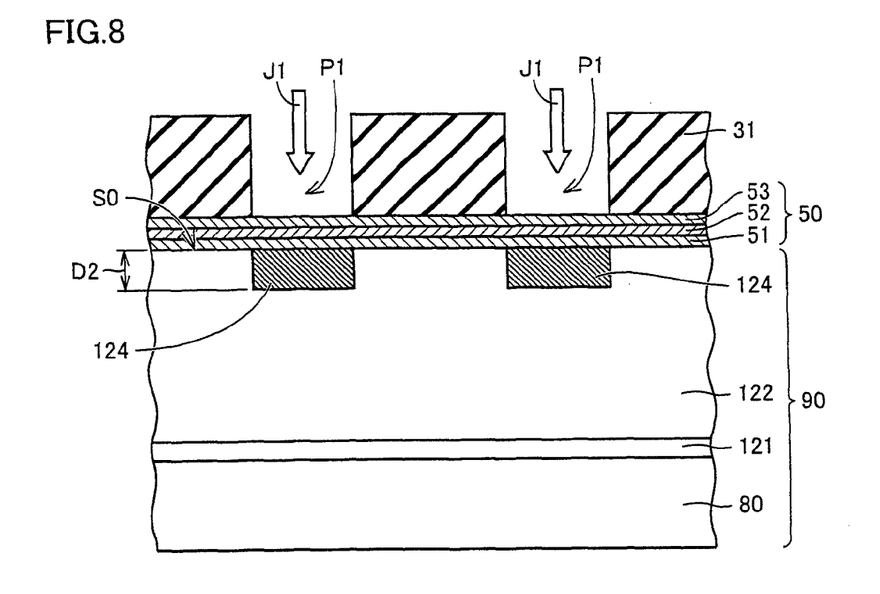
FIG. 8 is a schematic cross sectional view illustrating another part of the manufacturing steps of the exemplary method for manufacturing the silicon carbide semiconductor device shown in FIG. 1.

Next, as shown in FIG. 8, ions of an n type impurity are implanted by means of ion implantation J1 into epitaxial substrate 90 including silicon oxide film 31 having the first mask pattern, thereby forming n+ regions 124 each having n type conductivity.

Here, ion implantation J1 can be performed by, for example, implanting the ions of n type impurity into epitaxial substrate 90 from openings P1 of the first mask pattern of silicon oxide film 31 via etching stop layer 50. Accordingly, in portions of epitaxial substrate 90 below openings P1 of the first mask pattern of silicon oxide film 31, n+ regions 124 can be formed to have depth D2 from surface S0 of epitaxial substrate 90. An exemplary, usable n type impurity is phosphorus or the like.

Figure 9:
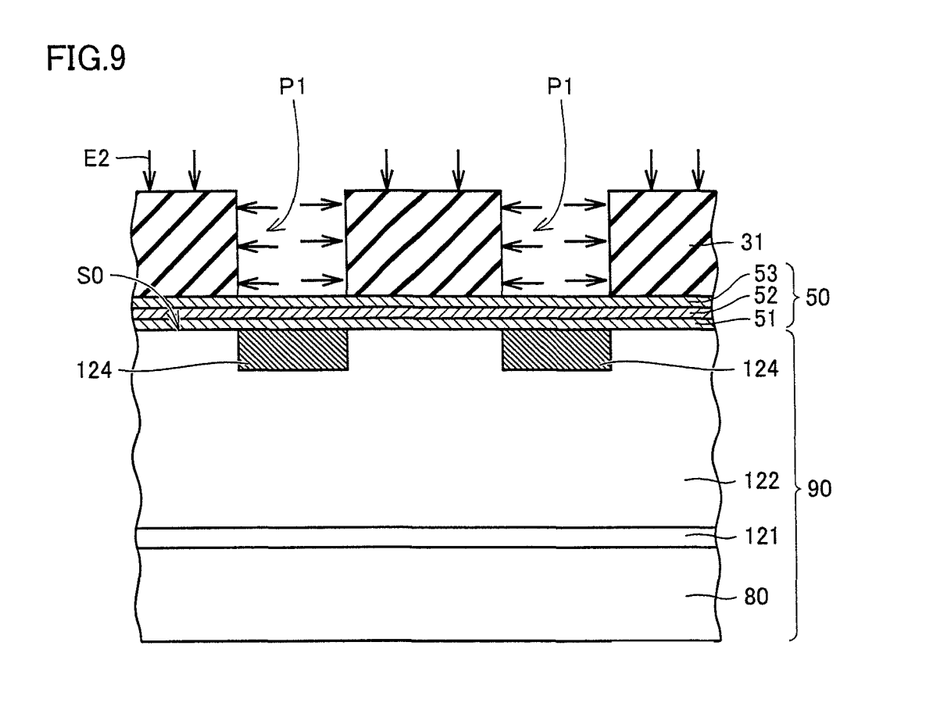
FIG. 9 is a schematic cross sectional view illustrating another part of the manufacturing steps of the exemplary method for manufacturing the silicon carbide semiconductor device shown in FIG. 1.
Figure 10:
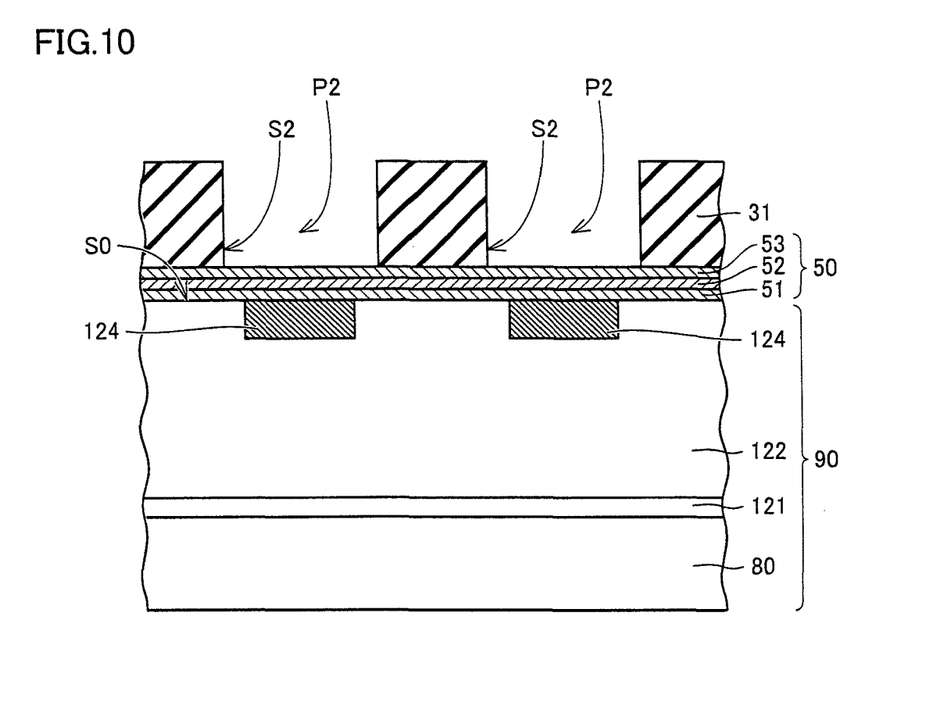
FIG. 10 is a schematic cross sectional view illustrating another part of the manufacturing steps of the exemplary method for manufacturing the silicon carbide semiconductor device shown in FIG. 1.

Next, as shown in FIG. 9, second etching E2 is performed to remove portions of silicon oxide film 31 having the first mask pattern. Accordingly, for example, as shown in FIG. 10, silicon oxide film 31 is provided with a second mask pattern having side walls S2 and openings P2 surrounded by side walls S2.

Here, as second etching E2, isotropy dry etching is performed using a second gas containing oxygen gas and at least one fluorine compound gas selected from a group consisting $CF_4$, $C_2F_6$, $C_3F_8$, and $SF_6$. Accordingly, the portions of silicon oxide film 31 are etched not only in the thickness direction (longitudinal direction) thereof but also in the width direction (lateral direction) thereof, thereby exposing a larger area of the surface of etching stop layer 50. Specifically, as a result of second etching E2, the height of each of side walls S2 of the second mask pattern becomes shorter than that of each of side walls S1 of the first mask pattern and the widths of each of openings P2 in the second mask pattern becomes narrower than that of each of openings P1 of the first mask pattern. It should be noted that the second gas may contain a gas other than the above-described fluorine compound gas and the oxygen gas. An example of such a gas is argon gas or the like.

In second etching E2, a ratio of the oxygen gas in the second gas is preferably 30 volume % or greater, more preferably, 50 volume % or greater, further preferably, 70 volume % or greater. As the ratio of the oxygen gas in the second gas is increased to 30 volume % or greater, 50 volume % or greater, and 70 volume % or greater, etching selectivity ((etching amount in the lateral direction per unit time)/(etching amount in the longitudinal direction per unit time)) tends to be larger. Accordingly, the width of each of the openings can be likely to become larger while restraining decrease of the thickness of silicon oxide film 31 (the height of each of the side walls). In order to perform second etching E2 efficiently, the ratio of the oxygen gas in the second gas is preferably 80 volume % or smaller.

The etching selectivity in second etching E2 is preferably not less than 0.5 and not more than 2, more preferably, not less than 1 and not more than 2. When the etching selectivity in second etching E2 is not less than 0.5 and not more than 2, in particular, not less than 1 and not more than 2, the width of each of the openings of silicon oxide film 31 can be more likely to be larger while restraining the decrease of the thickness of silicon oxide film 31.

Figure 11:
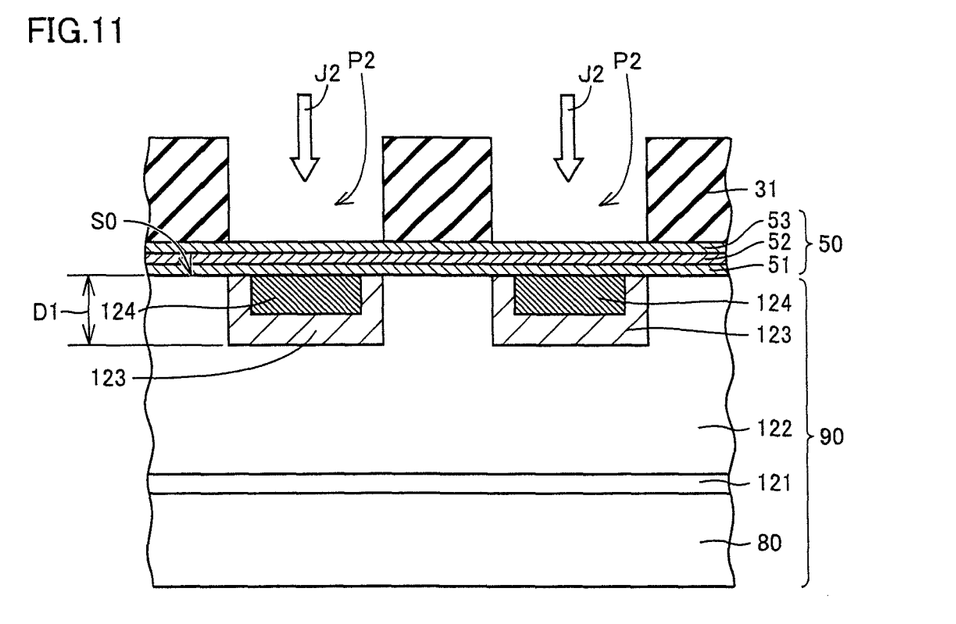
FIG. 11 is a schematic cross sectional view illustrating another part of the manufacturing steps of the exemplary method for manufacturing the silicon carbide semiconductor device shown in FIG. 1.

Next, as shown in FIG. 11, ions of a p type impurity are implanted by means of ion implantation J2 into epitaxial substrate 90 including silicon oxide film 31 having the second mask pattern, thereby forming p regions 123 each having p type conductivity.

Here, ion implantation J2 can be performed by, for example, implanting the ions of an p type impurity into epitaxial substrate 90 from openings P2 of the second mask pattern of silicon oxide film 31 via etching stop layer 50. Accordingly, in portions of epitaxial substrate 90 below openings P2 of the second mask pattern of silicon oxide film 31, p regions 123 can be formed to have depth D1 from surface S0 of epitaxial substrate 90. An exemplary, usable p type impurity is aluminum or the like.

Figure 12:
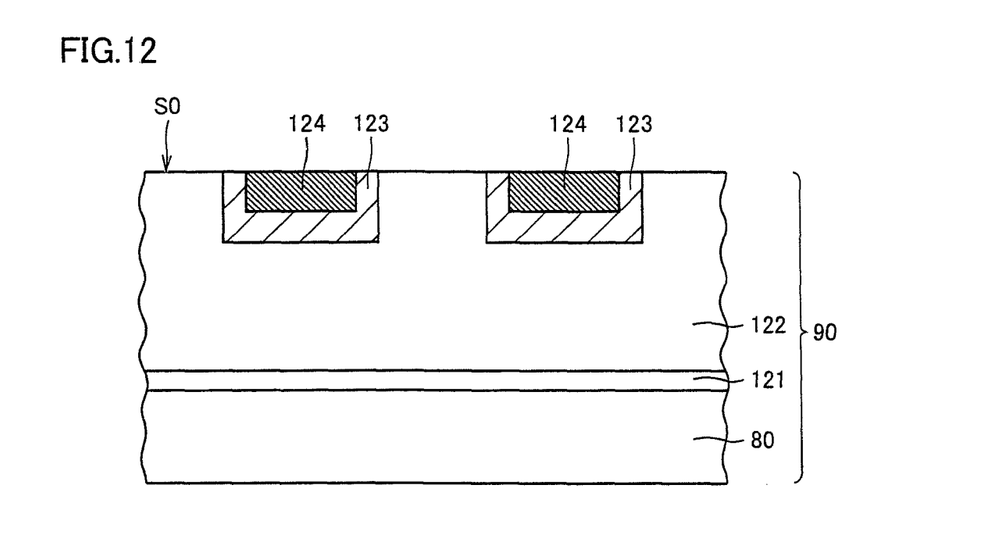
FIG. 12 is a schematic cross sectional view illustrating another part of the manufacturing steps of the exemplary method for manufacturing the silicon carbide semiconductor device shown in FIG. 1.

Next, as shown in FIG. 12, etching stop layer 50 and silicon oxide film 31 on surface S0 of epitaxial substrate 90 are removed. Accordingly, p regions 123 and n+ regions 124 are exposed at surface S0 of epitaxial substrate 90.

Here, etching stop layer 50 and silicon oxide film 31 can be removed by, for example, etching using hydrofluoric acid.

Thereafter, p regions 123 and n+ regions 124 in surface S0 of epitaxial substrate 90 are subjected to an activation annealing process. The activation annealing process can be performed by, for example, heating epitaxial substrate 90 in an argon atmosphere at 1700° C. for 30 minutes.

Figure 13:
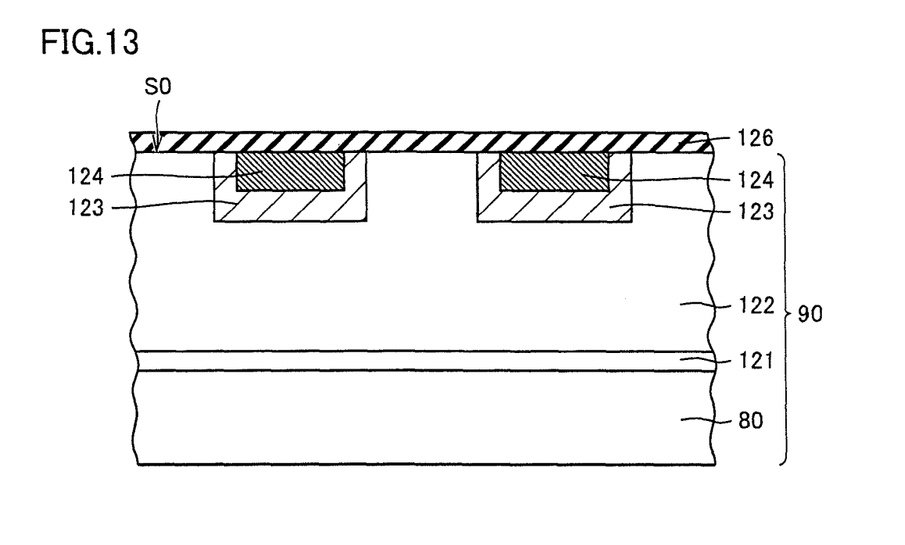
FIG. 13 is a schematic cross sectional view illustrating another part of the manufacturing steps of the exemplary method for manufacturing the silicon carbide semiconductor device shown in FIG. 1.

Next, as shown in FIG. 13, oxide film 126 is formed on surface S0 of epitaxial substrate 90. Here, oxide film 126 can be formed by means of, for example, dry oxidation (thermal oxidation) so as to cover breakdown voltage holding layer 122, p regions 123, and n+ regions 124, all of which are exposed at surface S0 of epitaxial substrate 90. The dry oxidation can be performed by, for example, heating epitaxial substrate 90 at 1200° C. for 30 minutes.

Figure 14:
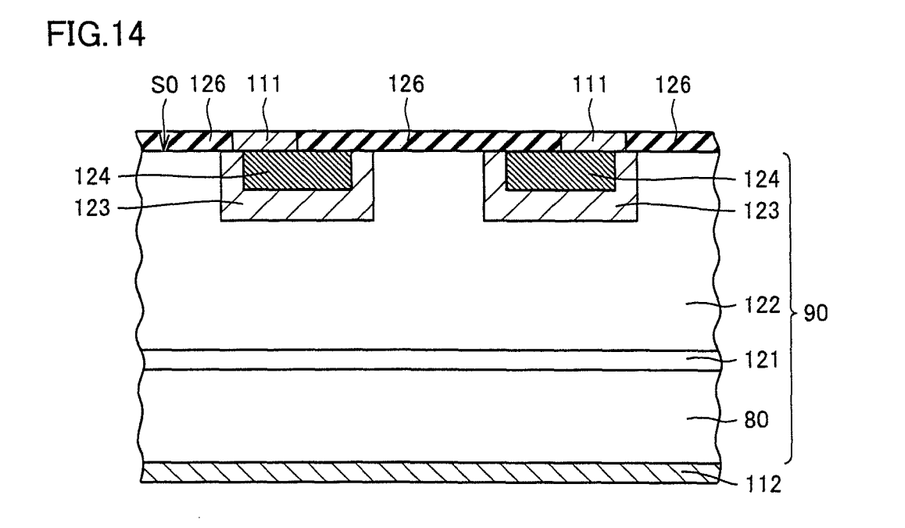
FIG. 14 is a schematic cross sectional view illustrating another part of the manufacturing steps of the exemplary method for manufacturing the silicon carbide semiconductor device shown in FIG. 1.

Next, as shown in FIG. 14, source electrodes 111 are formed on surface S0 of epitaxial substrate 90 and drain electrode 112 is formed on the backside surface of epitaxial substrate 90.

Here, each of source electrodes 111 can be formed as follows, for example. That is, first, a photoresist pattern having openings corresponding to portions at which source electrodes 111 are to be formed is formed on the surface of oxide film 126. Using this photoresist pattern as a mask, portions of oxide film 126 are removed to form openings. Thereafter, a conductive film is formed to cover the photoresist pattern and make contact with n+ regions 124 exposed through the openings of oxide film 126. Then, the photoresist pattern is removed by means of lift-off. In this way, the conductive film remaining on surface S0 of epitaxial substrate 90 is formed into source electrodes 111 making contact with n+ regions 124. It should be noted that as the conductive film, a metal film such as nickel (Ni) can be used, for example.

After the formation of source electrodes 111, it is preferable to perform heat treatment for alloying. Here, the heat treatment for alloying can be performed by, for example, heating epitaxial substrate 90 thus having source electrodes 111 formed thereon, in an argon atmosphere at 950° C. for 2 minutes.

Meanwhile, drain electrode 112 can be formed by, for example, sputtering nickel.

Thereafter, as shown in FIG. 1, on the surfaces of source electrodes 111, upper source electrodes 127 are formed. In addition, on the surface of oxide film 126, gate electrode 110 is formed. In this way, MOSFET 100 shown in FIG. 1 can be manufactured.

It should be noted that each of upper source electrodes 127 can be formed by, for example, sputtering nickel. It should be also noted that gate electrode 110 can be formed by forming a film of polycrystalline silicon using the CVD method, for example.

As described above, in the method for manufacturing the silicon carbide semiconductor device of the present embodiment, the double impurity regions different from each other in spreading can be formed with improved precision in spreading of the impurity regions by means of self-alignment using the silicon oxide film for the ion implantation mask rather than tungsten large in internal stress.

Conventionally, in manufacturing a semiconductor device using a silicon carbide substrate, it is very difficult to form double impurity regions different from each other in spreading, by means of self-alignment using the silicon oxide film as an ion implantation mask. A reason therefor is as follows. That is, it is difficult to etch a silicon oxide film in the lateral direction. This results in small etching selectivity, which makes it difficult to provide it with a second mask pattern for ion implantation of second ions. For this reason, tungsten with relatively large etching selectivity has been used conventionally as the ion implantation mask when forming double impurity regions different from each other in spreading by means of self-alignment.

However, as a result of diligent study conducted by the present inventor, it has been found that etching selectivity for a silicon oxide film can be increased by using the gas containing oxygen gas and at least one fluorine compound gas selected from a group consisting of $CF_4$, $C_2F_6$, $C_3F_8$, and $SF_6$. Accordingly, the present inventor has completed the present invention.

By using the silicon oxide film for the ion implantation mask as in the present embodiment, the silicon carbide substrate is not warped unlike in the case of using tungsten for the ion implantation mask. Thus, according to the method for manufacturing the silicon carbide semiconductor device of the present embodiment, precision in spreading of the double impurity regions can be increased with self-alignment.

Further, according to the method for manufacturing the silicon carbide semiconductor device of the present embodiment, the use of the silicon oxide film for the ion implantation mask can reduce problems such as metal contamination in the silicon carbide substrate, which takes place in the case of using tungsten for the ion implantation mask.

In the above-described embodiment, the p type conductivity and the n type conductivity may be replaced with each other. Further, although it has been illustrated in the above-described embodiment that epitaxial substrate 90 is used as the silicon carbide substrate, a silicon carbide single-crystal substrate or the like can be used instead of epitaxial substrate 90.

EXAMPLES

Experiment Example 1

An epitaxial substrate constituted by a stack of a single-crystal substrate, a buffer layer, and a breakdown voltage holding layer was fabricated by epitaxially growing a buffer layer and a breakdown voltage holding layer in this order on a single-crystal substrate made of n type silicon carbide single-crystal by means of the CVD method. The buffer layer was formed of an n type silicon carbide film (n type impurity concentration of $5 \times 10^{17}$ $cm^{-3}$) having a thickness of 0.5 µm. The breakdown voltage holding layer was formed of an n type silicon carbide film (n type impurity concentration of $5 \times 10^{15}$ $cm^{-3}$) having a thickness of 10 µm.

Next, the sputtering method was used to form, on the surface of the breakdown voltage holding layer of the epitaxial substrate, a first layer constituted by a titanium film having a thickness of 20 nm, a second layer constituted by a nickel layer having a thickness of 20 nm, and a third layer constituted by a titanium film having a thickness of 20 nm, in this order. In this way, an etching stop layer constituted by the stack of the first layer, the second layer, and the third layer was formed.

Next, on the surface of the third layer of the etching stop layer, a silicon oxide film formed of a $SiO_2$ film having a thickness of 2.5 µm was formed by means of the CVD method.

Next, on the surface of the silicon oxide film, a photoresist pattern was formed. Using the photoresist pattern as a mask, portions of the silicon oxide film were removed in the thickness direction thereof through anisotropic dry etching that utilizes $CHF_3$ gas as a first gas. Thereafter, the photoresist pattern was removed, thereby forming a first mask pattern in the silicon oxide film.

Next, phosphorous ions were implanted via the etching stop layer into the epitaxial substrate including the silicon oxide film having the first mask pattern, thereby forming n+ regions in the surface areas of the epitaxial substrate below the openings of the silicon oxide film.

Five sets of such epitaxial substrates having n+ regions formed therein as described above were prepared and labeled as samples No. 1 to No. 5.

Next, isotropy dry etching was performed for a predetermined period of time onto the silicon oxide film formed on the epitaxial substrate in each of samples No. 1 to No. 5, using a second gas having a second gas composition (volume ratio) indicated in Table 1, thereby removing portions of the silicon oxide film in the thickness direction (longitudinal direction) and the width direction (lateral direction).

Then, respective etching amounts in the lateral direction and the longitudinal direction per unit time during the above-described isotropy dry etching were calculated. Then, etching selectivity ((etching amount in the lateral direction per unit time)/(etching amount in the longitudinal direction per unit time)) for the silicon oxide film provided on the surface of the epitaxial substrate in each of samples No. 1 to No. 5 was found. Results thereof are shown in Table 1.

TABLE 1

| Sample No. | Second Gas Composition (Volume Ratio) | Etching Selectivity |
|---|---|---|
| 1 | $SF_6:O_2 = 7:3$ | 0.3 |
| 2 | $SF_6:O_2 = 5:5$ | 0.6 |
| 3 | $SF_6:O_2 = 3:7$ | 1.0 |
| 4 | $SF_6:O_2 = 2:8$ | 1.1 |
| 5 | $SF_6$ | 0.19 |

As shown in Table 1, it was confirmed that the etching selectivity for the silicon oxide film in each of samples No. 1 to No. 4 employing the mixed gas of $SF_6$ and $O_2$ as the second gas was greater than that for the silicon oxide film in sample No. 5 employing only $SF_6$ as the second gas. This indicates that the etching on the silicon oxide film in each of samples No. 1 to No. 4 can be likely to develop in the lateral direction as compared with the etching on the silicon oxide film in sample No. 5 in the lateral direction.

Further, as shown in Table 1, it was confirmed in experiment example 1 that as a ratio of $O_2$ in the second gas is increased, etching selectivity for the silicon oxide film is increased.

Experiment Example 2

Five sets of epitaxial substrates each having n+ regions formed therein in the same manner in experiment example 1 were prepared and were labeled as samples No. 6 to No. 10.

Next, isotropy dry etching was performed for a predetermined period of time onto the silicon oxide film formed on the epitaxial substrate in each of samples No. 6 to No. 10, using a second gas having a second gas composition (volume ratio) indicated in Table 2, thereby removing portions of the silicon oxide film in the thickness direction (longitudinal direction) and the width direction (lateral direction).

Then, respective etching amounts in the lateral direction and the longitudinal direction per unit time during the above-described isotropy dry etching were calculated. Then, etching selectivity ((etching amount in the lateral direction per unit time)/(etching amount in the longitudinal direction per unit time)) for the silicon oxide film provided on the surface of the epitaxial substrate in each of samples No. 6 to No. 10 was found. Results thereof are shown in Table 2.

TABLE 2

| Sample No. | Second Gas Composition (Volume Ratio) | Etching Selectivity |
|---|---|---|
| 6 | $CF_4:O_2 = 7:3$ | 0.3 |
| 7 | $CF_4:O_2 = 5:5$ | 0.6 |
| 8 | $CF_4:O_2 = 3:7$ | 1.0 |
| 9 | $CF_4:O_2 = 2:8$ | 1.1 |
| 10 | $CF_4$ | 0.28 |

As shown in Table 2, it was confirmed that the etching selectivity for the silicon oxide film in each of samples No. 6 to No. 9 employing the mixed gas of $CF_4$ and $O_2$ as the second gas was greater than that for the silicon oxide film in sample No. 10 employing only $CF_4$ as the second gas. This indicates that the etching on the silicon oxide film in each of samples No. 6 to No. 9 can be likely to develop in the lateral direction as compared with the etching on the silicon oxide film in No. 10 in the lateral direction.

Further, as shown in Table 2, it was confirmed also in experiment example 2 that as a ratio of $O_2$ in the second gas is increased, etching selectivity for the silicon oxide film is increased.

Experiment Example 3

Two sets of epitaxial substrates each having n+ regions formed therein in the same manner as in experiment example 1 and experiment example 2 were prepared and labeled as samples No. 11 and No. 12.

Next, isotropy dry etching was performed for a predetermined period of time onto the silicon oxide film formed on the epitaxial substrate of each of samples No. 11 and No. 12, using a second gas having a second gas composition (volume ratio) indicated in Table 3, thereby removing portions of the silicon oxide film in the thickness direction (longitudinal direction) and the width direction (lateral direction).

Then, respective etching amounts in the lateral direction and the longitudinal direction per unit time during the above-described isotropy dry etching were calculated. Then, etching selectivity ((etching amount in the lateral direction per unit time)/(etching amount in the longitudinal direction per unit time)) for the silicon oxide film provided on the surface of the epitaxial substrate in each of samples No. 11 and No. 12 was found. Results thereof are shown in Table 3.

TABLE 3

| Sample No. | Second Gas Composition (Volume Ratio) | Etching Selectivity |
|---|---|---|
| 11 | $Ar:O_2:CF_4 = 2:2:1$ | 1.08 |
| 12 | $Ar:O_2:CF_4 = 3:1:1$ | 0.43 |

As shown in Table 3, it was confirmed that the etching selectivity for the silicon oxide film in each of samples No. 11 and No. 12 employing the mixed gas of Ar, $CF_4$, and $O_2$ as the second gas was greater than that in each of samples No. 5 and No. 10 described above.

The present invention is applicable to a method for manufacturing a silicon carbide semiconductor device.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for manufacturing a silicon carbide semiconductor device, comprising the steps of:
    preparing a silicon carbide substrate;
    forming a silicon oxide film on said silicon carbide substrate;
    forming a first mask pattern of said silicon oxide film by removing a portion of said silicon oxide film by means of first etching employing a first gas containing $CHF_3$;
    forming a first impurity region having first conductivity type by means of ion implantation of a first ion into said silicon carbide substrate including said silicon oxide film having said first mask pattern;
    forming a second mask pattern of said silicon oxide film by removing a portion of said silicon oxide film by means of second etching employing a second gas containing oxygen gas and at least one fluorine compound gas selected from a group consisting of $CF_4$, $C_2F_6$, $C_3F_8$, and $SF_6$; and
    forming a second impurity region having second conductivity type different from said first conductivity type by means of ion implantation of a second ion into said silicon carbide substrate including said silicon oxide film having said second mask pattern.

2. The method for manufacturing the silicon carbide semiconductor device according to claim 1, wherein a ratio of said oxygen gas in said second gas is 30 volume % or greater.

3. The method for manufacturing the silicon carbide semiconductor device according to claim 1, wherein etching selectivity in said second etching is not less than 0.5 and not more than 2.

4. The method for manufacturing the silicon carbide semiconductor device according to claim 1, wherein the step of forming said silicon oxide film includes the steps of: forming an etching stop layer on said silicon carbide substrate; and forming said silicon oxide film on said etching stop layer.

5. The method for manufacturing the silicon carbide semiconductor device according to claim 4, wherein said etching stop layer contains at least one metal selected from a group consisting of nickel, aluminum, and titanium.

6. The method for manufacturing the silicon carbide semiconductor device according to claim 5, wherein said etching stop layer is constituted by a stack in which a first layer made of titanium, a second layer made of nickel or aluminum, and a third layer made of titanium are stacked in this order from the silicon carbide substrate side.

* * * * *